(12) United States Patent
Tao et al.

(10) Patent No.: US 8,269,530 B2
(45) Date of Patent: Sep. 18, 2012

(54) FREQUENCY DOUBLER, A DEVICE INCLUDING THE SAME AND A METHOD FOR FREQUENCY DOUBLING

(75) Inventors: Yunbin Tao, Shanghai (CN); Jiazhou Liu, Shanghai (CN)

(73) Assignee: Beken Corporation, Shanghai (CN)

( * ) Notice: Subject to any disclaimer, the term of this patent is extended or adjusted under 35 U.S.C. 154(b) by 108 days.

(21) Appl. No.: 12/987,159

(22) Filed: Jan. 10, 2011

(65) Prior Publication Data

US 2012/0161824 A1    Jun. 28, 2012

(51) Int. Cl.
*H03B 19/00* (2006.01)
(52) U.S. Cl. .................. 327/122; 327/116; 327/119
(58) Field of Classification Search .................. 327/122, 327/116, 119
See application file for complete search history.

(56) References Cited

U.S. PATENT DOCUMENTS

| | | | |
|---|---|---|---|
| 4,101,789 A * | 7/1978 | Ruhnau | 327/72 |
| 6,091,271 A * | 7/2000 | Pant et al. | 327/122 |
| 6,198,317 B1 * | 3/2001 | Chow et al. | 327/116 |
| 6,246,271 B1 * | 6/2001 | Takada et al. | 327/116 |
| 6,337,588 B1 * | 1/2002 | Chen | 327/122 |
| 6,815,991 B2 * | 11/2004 | Yee et al. | 327/172 |
| 7,375,599 B2 * | 5/2008 | Molina | 331/143 |
| 7,535,269 B2 * | 5/2009 | Utsuno | 327/116 |
| 7,786,780 B2 * | 8/2010 | Farnsworth | 327/175 |
| 2001/0043103 A1 * | 11/2001 | Uehara et al. | 327/175 |
| 2007/0030081 A1 * | 2/2007 | Shin et al. | 331/45 |

* cited by examiner

*Primary Examiner* — Ryan Jager
(74) *Attorney, Agent, or Firm* — Perkins Coie LLP; Aaron Wininger

(57) ABSTRACT

A frequency doubler comprises: a non-overlapping signal generation circuit configured to receive a first signal and a first control signal and generate a first and second non-overlapping signals, each of the first and second non-overlapping signals has a frequency of the first signal, an average of a duty cycle of the first non-overlapping signal and a duty cycle of the second non-overlapping signal is determined by the first control signal; a combination circuit configured to receive and combine the two non-overlapping signals to generate a frequency-doubled signal.

16 Claims, 12 Drawing Sheets

FREQUENCY DOUBLER, A DEVICE INCLUDING THE SAME AND A METHOD FOR FREQUENCY DOUBLING

CLAIM OF PRIORITY

This application claims priority to Chinese Application number 201010609376.4 entitled "A FREQUENCY DOUBLER, A DEVICE INCLUDING THE SAME AND A METHOD FOR FREQUENCY DOUBLING", filed on Dec. 28, 2010, which is incorporated herein by reference.

TECHNICAL FIELD

The present application relates to frequency doubling, particularly to a frequency doubler, a device including the same and a method for frequency doubling.

BACKGROUND OF THE INVENTION

Phase lock loop (PLL) circuits are often employed in conventional frequency doublers. However, a PLL circuit has a very large area and a complicated structure. In addition, a PLL circuit cannot be employed in some power-consumption-sensitive devices.

Therefore, a frequency doubler, with a relatively smaller area, lower complexity and/or lower power consumption, is desirable.

BRIEF DESCRIPTION OF THE INVENTION

To this end, according to an embodiment of the present invention, a frequency doubler comprises:
a non-overlapping signal generation circuit configured to receive a first signal and a first control signal and generate a first and second non-overlapping signals, each of the first and second non-overlapping signals having a frequency of the first signal, wherein an average of a duty cycle of the first non-overlapping signal and a duty cycle of the second non-overlapping signal is determined at least partly by the first control signal;
a combination circuit configured to receive and combine the two non-overlapping signals to generate a frequency-doubled signal.

According to another embodiment of the invention, a method comprises:
receiving a first signal with a frequency doubler, the frequency doubler including:
a non-overlapping signal generation circuit configured to receive a first signal and a first control signal and generate a first and second non-overlapping signals, each of the first and second non-overlapping signals has a frequency of the first signal, an average of a duty cycle of the first non-overlapping signal and a duty cycle of the second non-overlapping signal is determined at least partly by the first control signal;
a combination circuit configured to receive and combine the two non-overlapping signals to generate a frequency-doubled signal;
doubling a frequency of the first signal with the frequency doubler.

A frequency doubler according to at least one embodiment of the invention generates frequency-doubled signal with a precise duty cycle. In addition, the frequency doubler has relatively smaller area and hence is adaptable for integration. Also, in contrast to frequency doublers with PLLs, the frequency doubler according to an embodiment of the invention has lower power consumption and complexity. Moreover, a sudden change of a duty cycle of a signal input to the frequency doubler has no considerable effect on a frequency-doubled signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-know structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
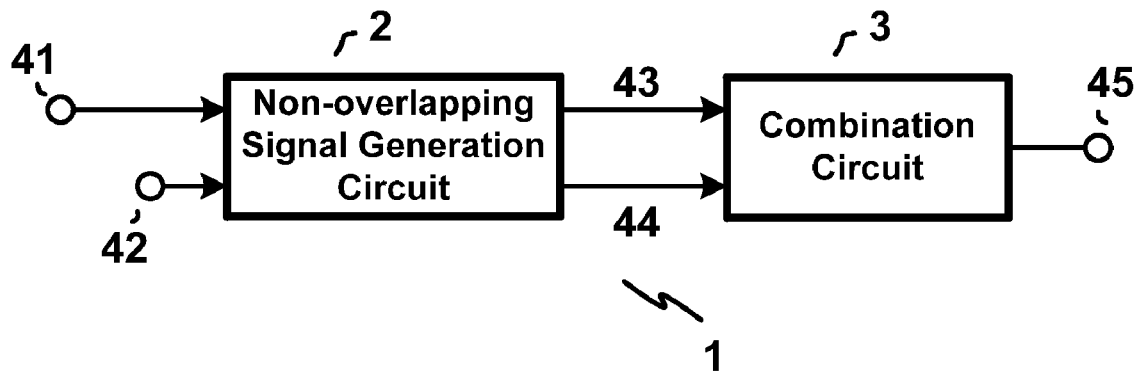
FIG. 1 is a block diagram illustrating a frequency doubler according to an embodiment of the present invention.

FIG. 1 is a block diagram illustrating a frequency doubler according to an embodiment of the present invention. As illustrated, the frequency doubler 1 includes a non-overlapping signal generation circuit (hereinafter referred to as generation circuit) 2 and a combination circuit 3.

The generation circuit 2 is configured to receive a first signal 41 and a first control signal 42 and generate a first and a second non-overlapping signals 43 and 44. Each of the first and second non-overlapping signals has a frequency of the first signal, i.e., f. An average of a duty cycle of the first non-overlapping signal 43 and a duty cycle of the second non-overlapping signal 44 is determined at least partly by the first control signal 42.

The combination circuit 3 is configured to receive and combine the two non-overlapping signals. Since signals 43 and 44 both have a frequency at f and are non-overlapping, the combined signal has a frequency of 2f. According to an embodiment of the invention, the combination circuit 3 includes an OR gate, as will be described further below.

Figure 2:
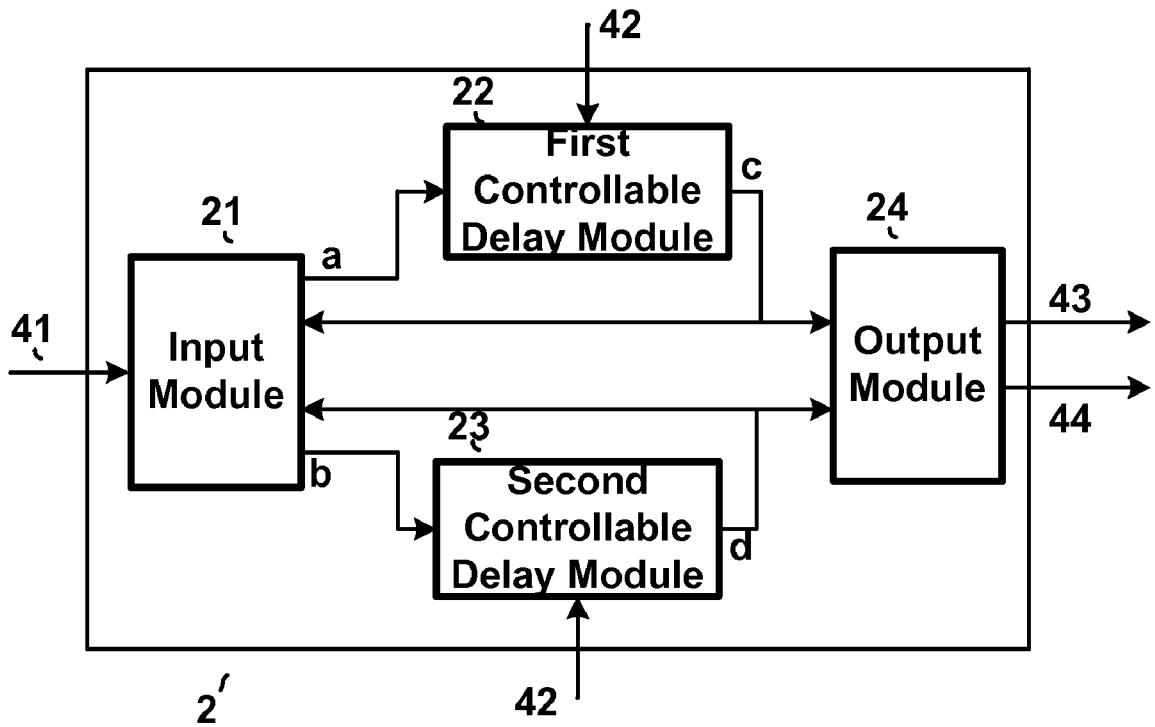
FIG. 2 is a block diagram illustrating a non-overlapping signal generation circuit according to an embodiment of the present invention.

The generation circuit 2 in an embodiment of the invention is illustrated in FIG. 2. As illustrated, the generation circuit 2 includes an input module 21, a first controllable delay module 22, a second controllable delay module, and an output module 24.

Specifically, the input module 21 is configured to receive the first signal 41 and generated a first clock signal a and a second clock signal b. The first controllable delay module 22 receives the first clock signal a and a first control signal 42, then applies a first delay determined by the first control signal 42 to the first clock signal a to generate a first delayed signal c. The second controllable delay module 23 receives the second clock signal b and the first control signal 42, then applies a second delay determined at least partly by the first control signal 42 to the second clock signal b to generate a second delayed signal d.

The output module 24 receives the first delayed signal c and the second delayed signal d, and generates the first non-overlapping signal 43 based on signal c and generated the second non-overlapping signal 44 based on signal d.

In addition, as illustrated in FIG. 2, the input module 21 receives the first delayed signal c and the second delayed signal d, and uses the delayed signals and the first signal 41 to generate the first clock signal a and the second clock signal b.

Therefore, the two non-overlapping signals are both in connection with the first delay and the second delay which are determined at least partly by the first control signal 42. According to an embodiment of the invention, in this way, an average of the duty cycle of the first and second non-overlapping signals is determined at least partly by the first control signal 42.

According to embodiments of the invention, the first control signal 42 may be a DC voltage signal designed to provide the first and second non-overlapping signals with a desirable average duty cycle, e.g., 2 Volts. According to an embodiment of the invention, the first control signal 42 can be controlled manually or automatically, which will be further described below.

The non-overlapping signal generation circuit 2 according to embodiments of the invention may have various configurations, one of which will be taken as a primary example hereinafter without loss of generality.

Figure 3:
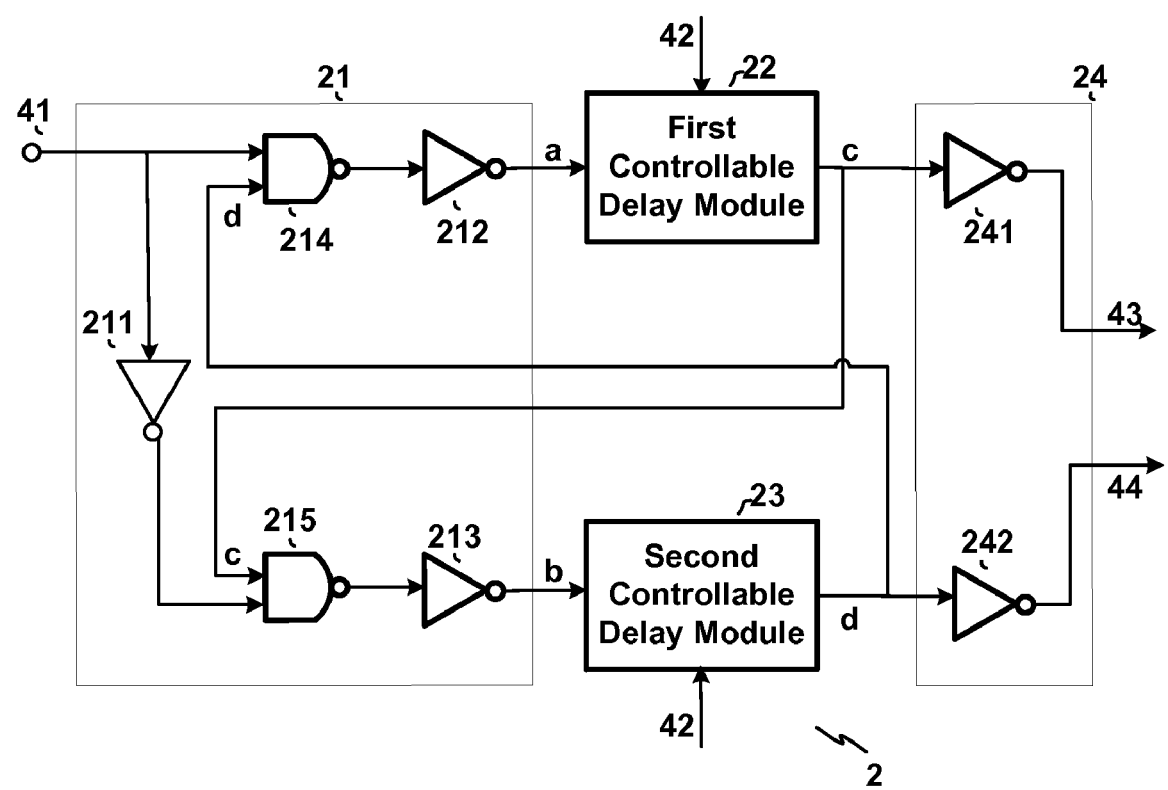
FIG. 3 is a circuit diagram illustrating a detailed view of the non-overlapping signal generation circuit in FIG. 2.

As illustrated in FIG. 3, the input module 21 includes a first inverter 211, a second inverter 212, a third inverter 213, a first NAND gate 214 and a second NAND gate 215.

An input end of the first inverter 211 and an input end of the first NAND gate 214 receive the first signal 41. Another input end of the first NAND gate 214 receives the second delayed signal d. The first inverter 211 inverts the signal 41 and provides an inverted signal to an input end of the second NAND gate 215. Another input end of the second NAND gate 215 receives the first delayed signal c. An output end of the first NAND gate 214 is connected to an input end of the second inverter 212. An output end of the second NAND gate 215 is connected to an input end of the third inverter 213. The second inverter 212 is configured to output the first clock signal a, the third inverter is configured to output the second clock signal b.

According to the embodiment illustrated in FIG. 3, the output module 24 includes a fourth inverter 241 configured to receive the first delayed signal c and generate the first non-overlapping signal 43, hence the first non-overlapping signal 43 is the first delayed signal c after inversion. The output module 24 further includes a fifth inverter 242 configured to receive the second delayed signal d and generate the second non-overlapping signal 44, hence the second non-overlapping signal 44 is the second delayed signal d after inversion. Reference will be made to the first and second controllable delay modules 22 and 23 below in detail.

Figure 4:
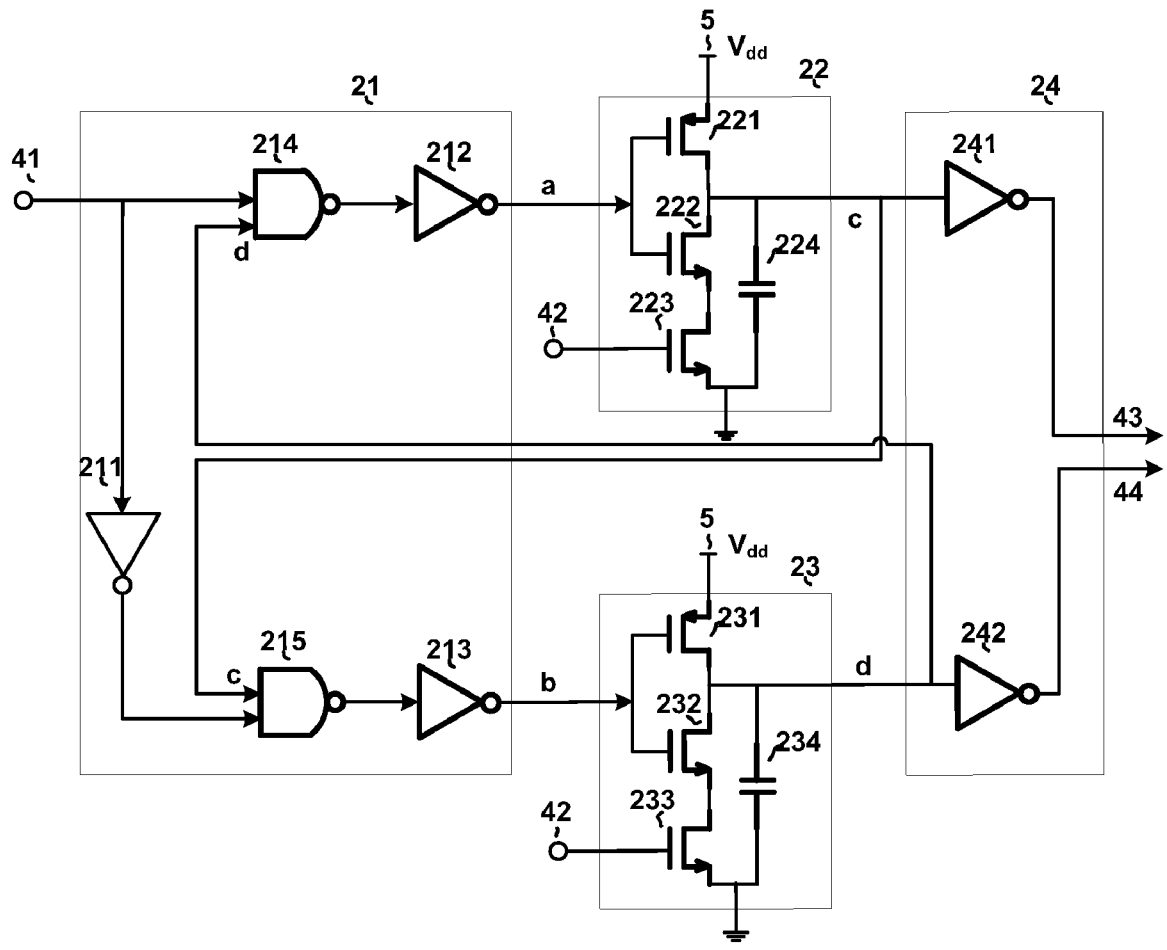
FIG. 4 is a circuit diagram illustrating a detailed view of the non-overlapping signal generation circuit in FIG. 2.

Refer to FIG. 4, wherein a circuit diagram of the non-overlapping signal generation circuit 2 according to an embodiment is illustrated. The first controllable delay module 22 includes: a first P-type MOSFET 221 (MOS 221), a first N-type MOSFET 222 (MOS 222), a second N-type MOSFET 223 (MOS 223) and a first capacitor 224.

Specifically, in the delay module 22, a source of the MOS 221 is provided with a positive working voltage, such as $V_{dd}$. A gate of the MOS 221 and a gate of the MOS 222 are configured to receive the first clock signal a. A source of the MOS 222 is connected with a drain of the MOS 223. A drain of the MOS 221 is connected with a drain of the MOS 222 and a terminal (upper terminal in FIG. 4) of the first capacitor 224 to generate the first delayed signal c. A source of the MOS 223 and another terminal (lower terminal in FIG. 4) of the first capacitor 224 are grounded. A gate of the MOS 223 is configured to receive the first control signal 42.

Similarly, in the delay module 23, a source of the MOS 231 is provided with a positive working voltage, e.g., $V_{dd}$. A gate of the MOS 231 and a gate of the MOS 232 are configured to receive the second clock signal b. A source of the MOS 232 is connected with a drain of the MOS 233. A drain of the MOS 231 is connected with a drain of the MOS 232 and a terminal (upper terminal in FIG. 4) of the second capacitor 234 to generate the second delayed signal d. A source of the MOS 233 and another terminal (lower terminal in FIG. 4) of the second capacitor 234 are grounded. A gate of the MOS 233 is configured to receive the first control signal 42.

Figure 12:
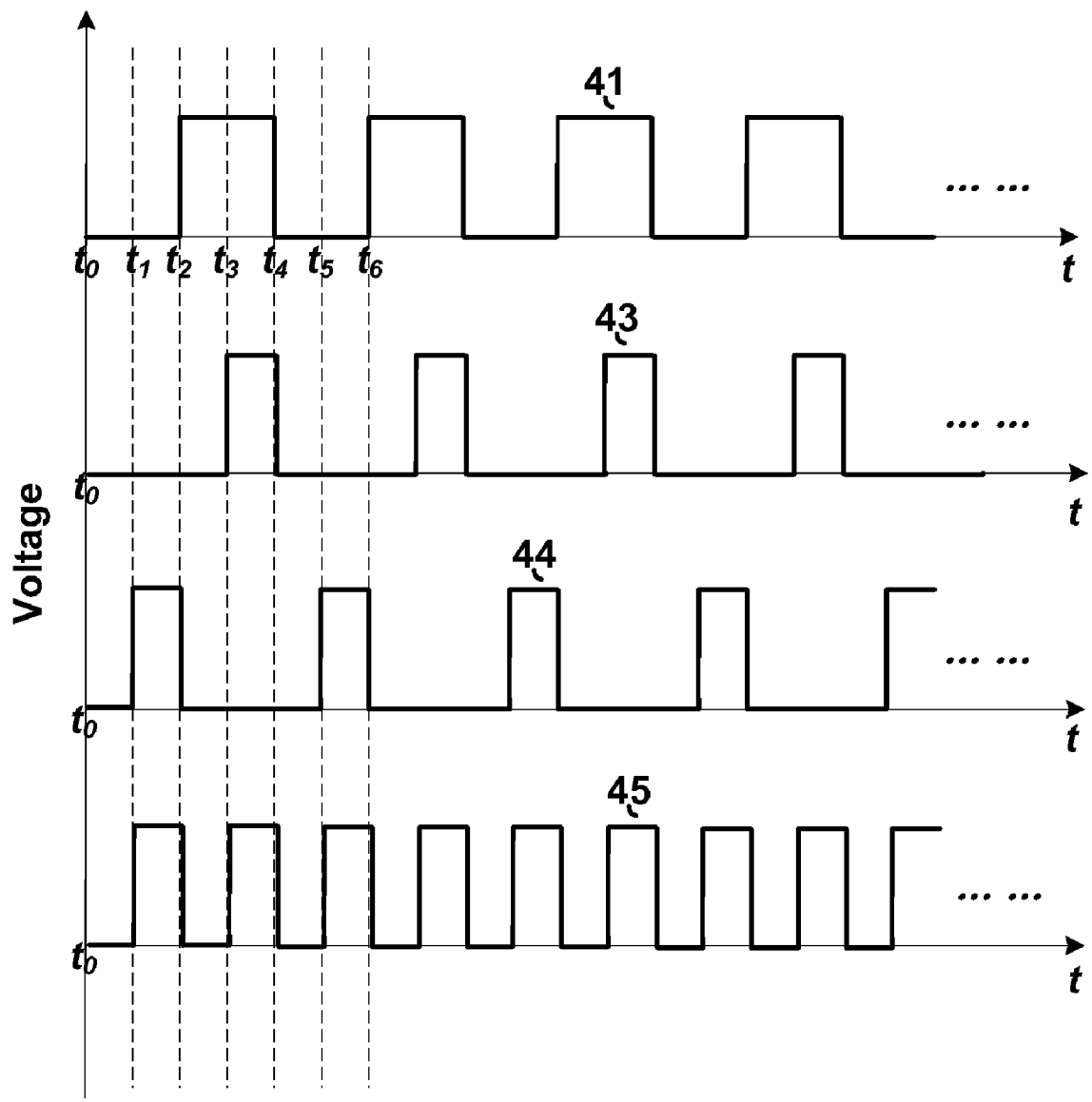
FIG. 12 is a drawing illustrating wave forms of signals in a frequency doubler according to an embodiment of the present invention.

Examining FIG. 4 and FIG. 12, when signal 41 is digital 0, e.g., at $t_1$, an output of the first NAND gate 214 is digital 1. The second inverter 212 then outputs digital 0. The MOS 221 is hence closed, and a potential at the upper terminal of the first capacitor 224 is approximately $V_{dd}$ (i.e., digital 1). Therefore, the first non-overlapping signal 43 is digital 0 when the signal 41 is digital 0, as illustrated in FIG. 12.

When signal 41 changes from digital 0 to digital 1, e.g., at $t_2$, the output of the first NAND gate 214 depends on the second delayed signal d which can be determined as following: since signal 41 is digital 1, the inverter 211 outputs digital 0, then the second NAND gate 215 outputs digital 1, the second clock signal b is digital 0. The MOS 231 is closed by signal b, hence a potential at an upper terminal of the second capacitor 234 is $V_{dd}$. That's to say, when the signal 41 is digital 1, the signal d which is provided to the first NAND gate 214 and the fifth inverter 242 is digital 1. Thus, it can be seen that when signal 41 is digital 1, the second non-overlapping signal 44 is digital 0, and the first NAND gate 214 outputs digital 0. Therefore, the first clock signal a is digital 1 when signal 41 is digital 1. The MOS 222 is hence closed while the MOS 221 is open by the first clock signal a. According to an embodiment of the invention, a voltage of the first control signal 42 is positive, hence the upper terminal of the capacitor 224 discharges through the MOSs 222 and 223. Note the current flowing in the MOS 223 is determined by the voltage of signal 42, the capacitor 224 discharges at a speed determined by the first control signal 42. When the potential at the upper terminal of the capacitor 224 (i.e., the voltage of signal c) reaches a turn-over voltage of the fourth inverter 241, e.g., at $t_3$, the first non-overlapping signal 43 changes from digital 0 to 1.

When signal 41 changes from digital 1 to digital 0, e.g, at $t_4$, similar to as mentioned with respect to the first delayed signal c, a voltage of the second delayed signal d begins to decrease. When the voltage of signal d reaches a turn-over voltage of the inverter 242, e.g., at $t_5$, the second non-overlapping signal 44 will change from digital 0 to 1.

Taking the first controllable delay module 22 as an example, a time duration for the capacitor 224 to turn over the inverter 241 is determined by the MOSs 222, 223, the capacitor 224 and the first control signal 42. It can be seen that the time duration will change with the first control signal 42.

In case the combination circuit 3 includes an OR gate, the frequency-doubled signal 45 takes a form shown in FIG. 12.

Examining two circumstances, 1: the first control signal 42 has a voltage at 2 Volts; 2: the first control signal 42 has a voltage at 1 Volt. It can be seen that in circumstance 1, the fourth inverter 241 is turned over earlier than in circumstance 2, which means the first non-overlapping signal 43 has a higher duty cycle in circumstance 1 than in circumstance 2.

Therefore, an average duty cycle of the two non-overlapping signals is determined at least partly by the first control signal 42. According to an embodiment of the invention, there is provided a user input device coupled to a source generating the first control signal, an operator can conveniently control the average duty cycle by operating the user input device.

According to an embodiment of the invention, the non-overlapping signal generation circuit is symmetrical, e.g., the elements therein arranged to abut one another, elements with corresponding functions such as the NAND gates 214 and 215, inverters 212 and 213 have approximately the same electrical parameters. In this way, an error in adjacent periods of a frequency-doubled signal can be restricted to a considerably low value, such as about 1%.

According to another embodiment of the invention, a terminal of the capacitor 224 (lower terminal illustrated in FIG. 4) is connected to Vdd while the other terminal is still connected to the drains of MOSs 222 and 221, a terminal of the capacitor 234 (lower terminal illustrated in FIG. 4) is connected to Vdd while the other terminal is still connected to the drains of MOSs 232 and 231.

Figure 5:
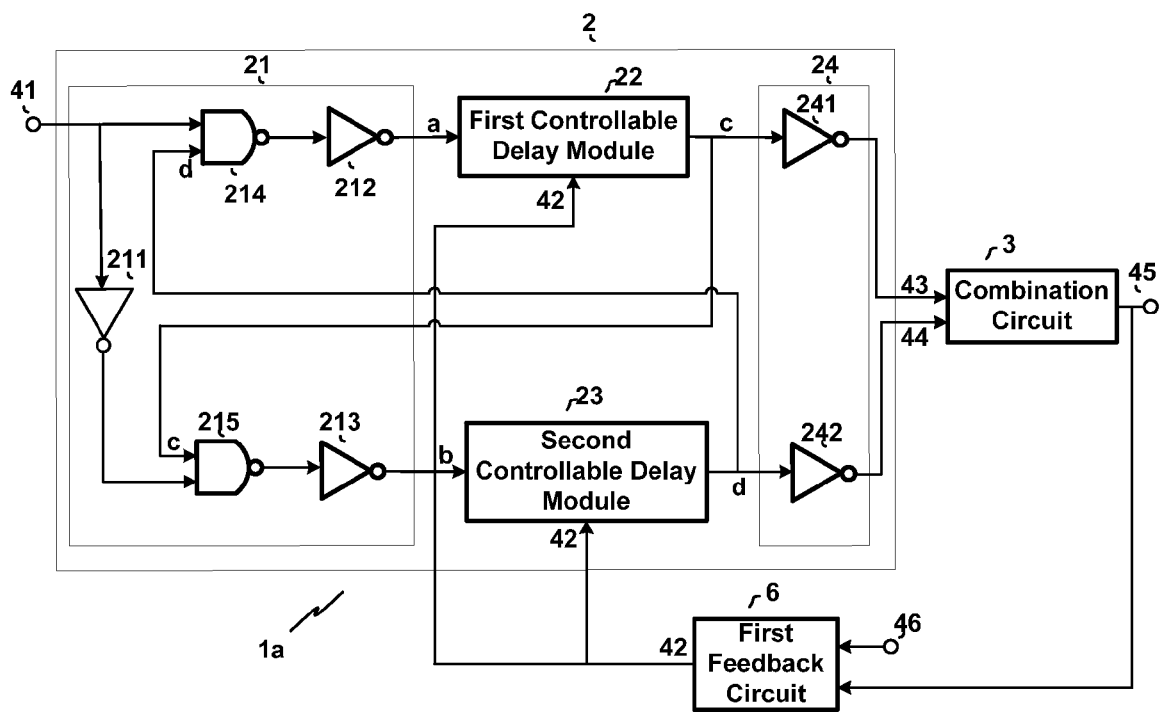
FIG. 5 is a block diagram illustrating a frequency doubler according to another embodiment of the present invention.
Figure 6:
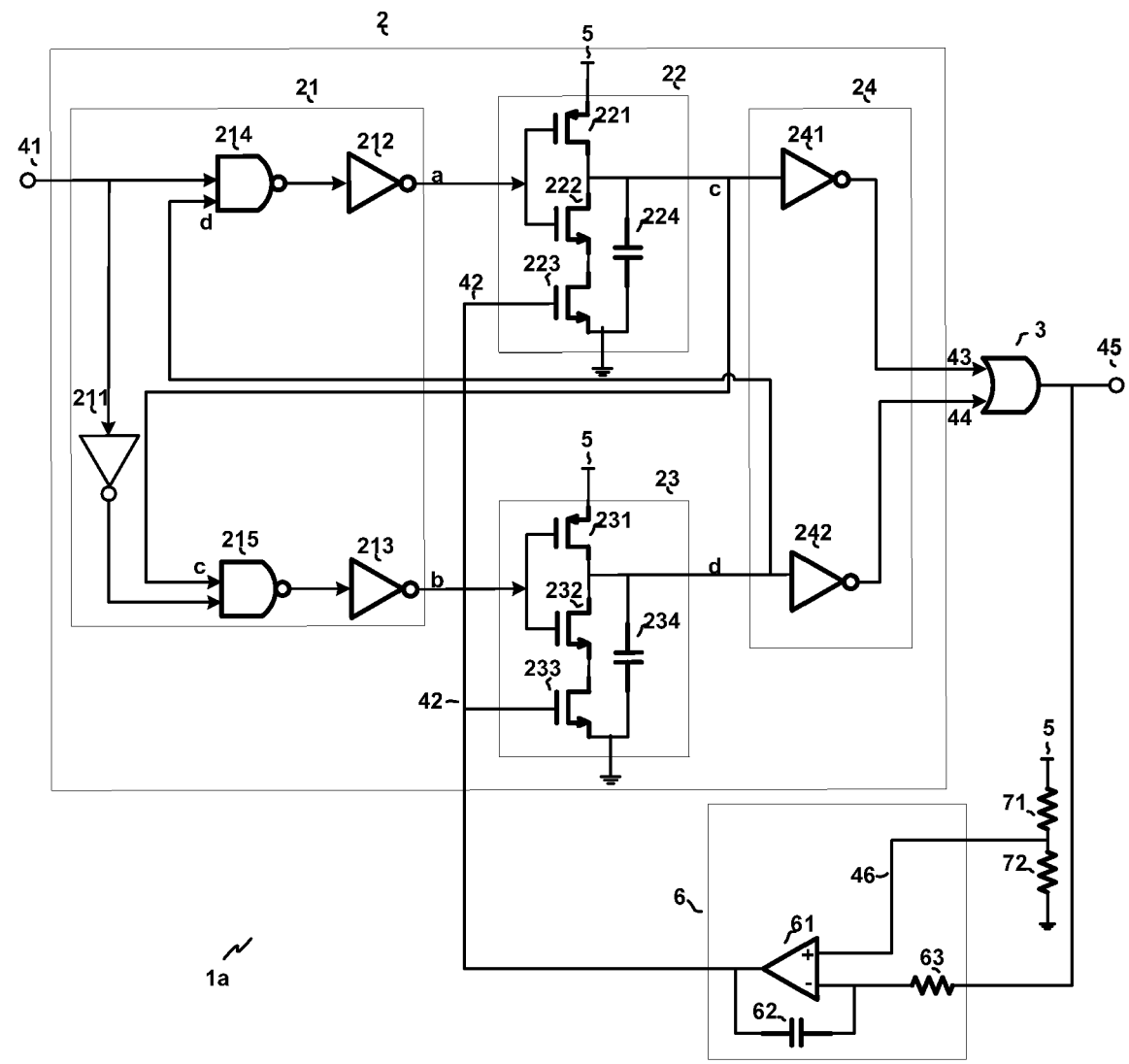
FIG. 6 is a circuit diagram illustrating a detailed view of the frequency doubler in FIG. 5.

According to an embodiment of the invention, the first control signal can be controlled automatically. Reference will be made thereto by referring to FIGS. 5-6.

As illustrated in FIG. 5, the non-overlapping signal generation circuit 1a further comprises a first feedback circuit 6. The first feedback circuit 6 is configured to receive and use the frequency doubled signal 45 and a first reference signal 46 to generate the first control signal 42.

The first feedback circuit 6 has various embodiments including the one illustrated in FIG. 6.

The first feedback circuit 6 in FIG. 6 includes a first error amplifier 61, a capacitor 62 and a first resistor 63. The error amplifier 61 receives a reference signal 46 from a joint terminal of a second resistor 71 and a third resistor 72. As the second and third resistors are connected in series between Vdd and the ground, a potential at their joint terminal, i.e., the voltage of signal 46 is determined by resistances thereof. For example, if the resistance of resistor 71 is 400Ω while the resistance of resistor 72 is 600Ω, the voltage of signal 46 will be 0.4 Vdd. The capacitor 62 and the first resistor 63 form an integral circuit which supplies an average voltage of the frequency-doubled signal 45 to a negative input end of the error amplifier 61. The average voltage of the signal 45 can be calculated with equation (1):

$$V_{average} = Duty_{45} * V_{dd} \quad (1)$$

Where $Duty_{45}$ is a duty cycle of signal 45.

Therefore, an error between the voltage of the signal 46 and the average voltage of the signal 45 is amplified as the first control signal 42. For example, when the resistors 71 and 72 have the same resistance, the duty cycle of the signal 45 is 40%, the first control signal 42 will have a voltage around Vdd. Therefore, capacitors 224 and 234 discharge more quickly, the inverters 241 and 242 are then turned over earlier than before. As a result, the duty cycle of the signal 45 is increased to 50%. At last, the voltage of the first control signal 42 stops at a certain value which sets the duty cycle of the signal 45 to 50% as determined by the signal 46.

It can be seen that, by changing the voltage of signal 46, the average duty cycle of the signal 45 can be conveniently controlled. For example, when the voltage of signal 46 is 0.3 Vdd, the average duty cycle of signal 45 will be 0.3.

With a frequency doubler 1 or 1a as discussed above, while the average duty cycle of signal 45 is well controlled, the duty cycle may change in different periods. In accordance with another embodiment of the invention described below, the duty cycle of signal 45 can be kept constant.

Figure 7:
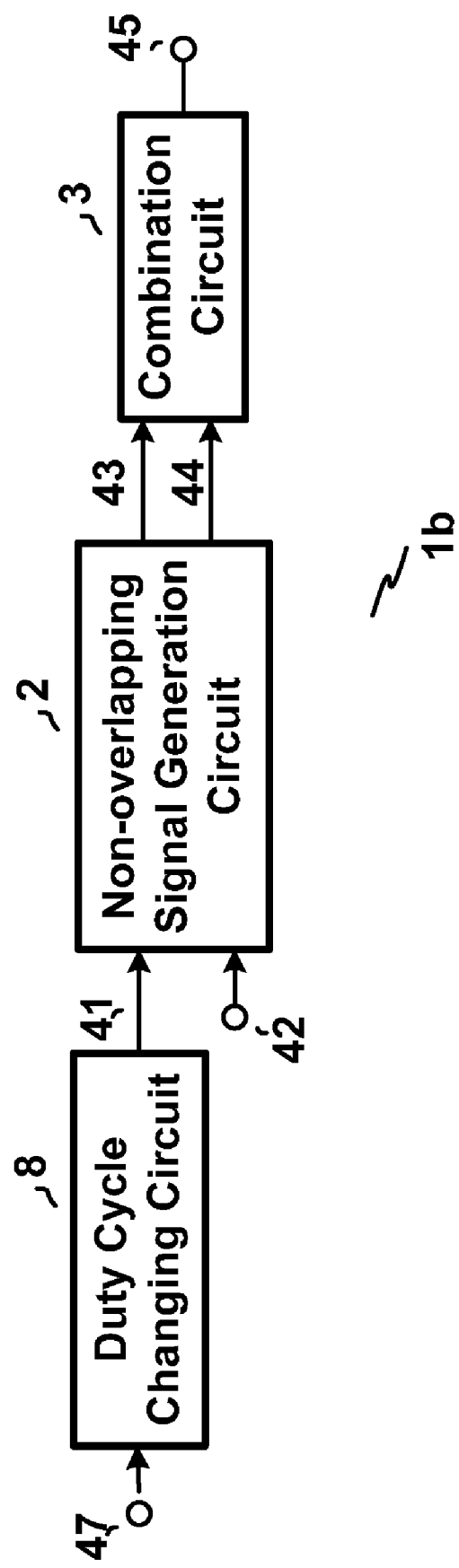
FIG. 7 is a block diagram illustrating a frequency doubler according to still another embodiment of the present invention.

To this end, as illustrated in FIG. 7, a frequency doubler 1b further includes a duty cycle changing circuit 8. The duty cycle changing circuit 8 is configured to receive a second signal 47 and change a duty cycle of the second signal 47 to a preset value, so as to generate the first signal 41.

According to an embodiment of the invention, the preset value is about 50%.

Figure 8:
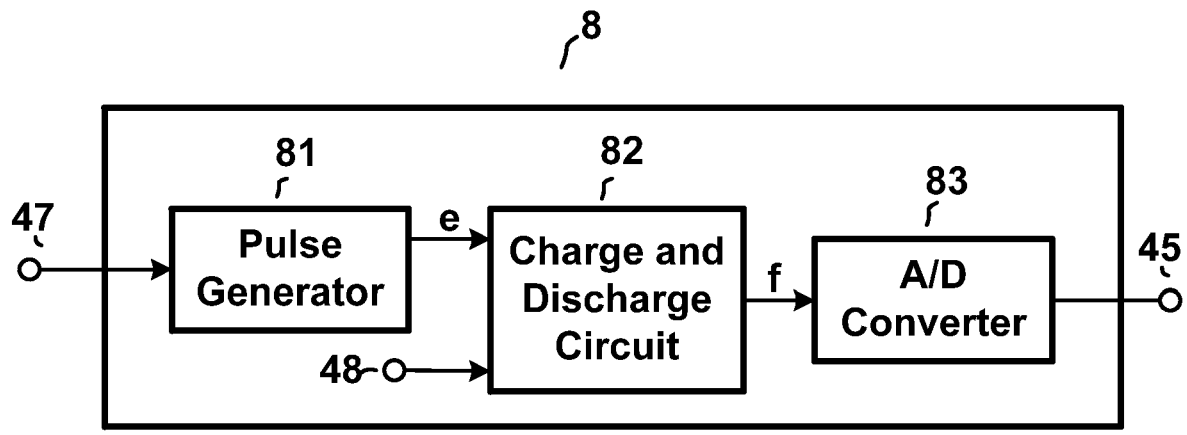
FIG. 8 is a block diagram illustrating a duty cycle changing circuit according to an embodiment of the present invention.

As illustrated in FIG. 8, according to an embodiment of the invention, the duty cycle changing circuit 8 includes a pulse generator 81, a charging and discharge circuit 82 and an analog-to-digital converter (ADC) 83.

Figure 13:
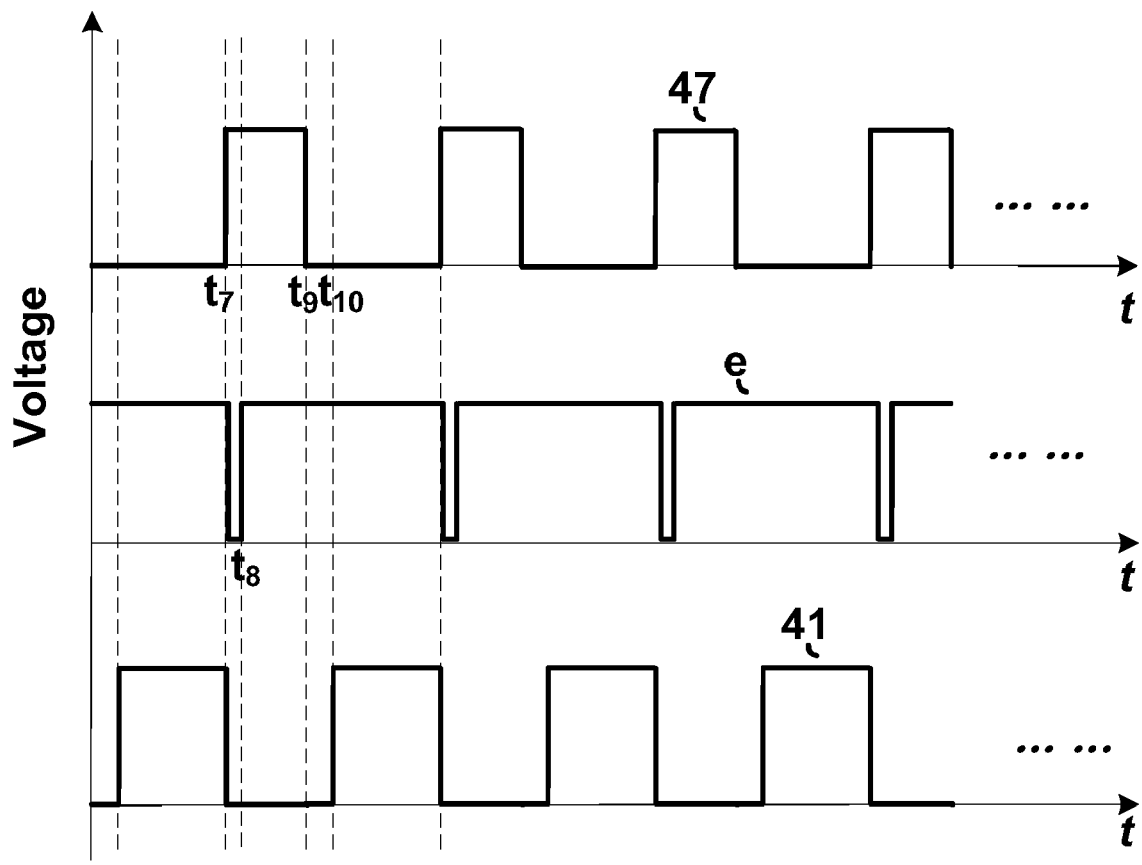
FIG. 13 is a drawing illustrating wave forms of signals in a duty changing circuit according to an embodiment of the present invention.
Figure 14:
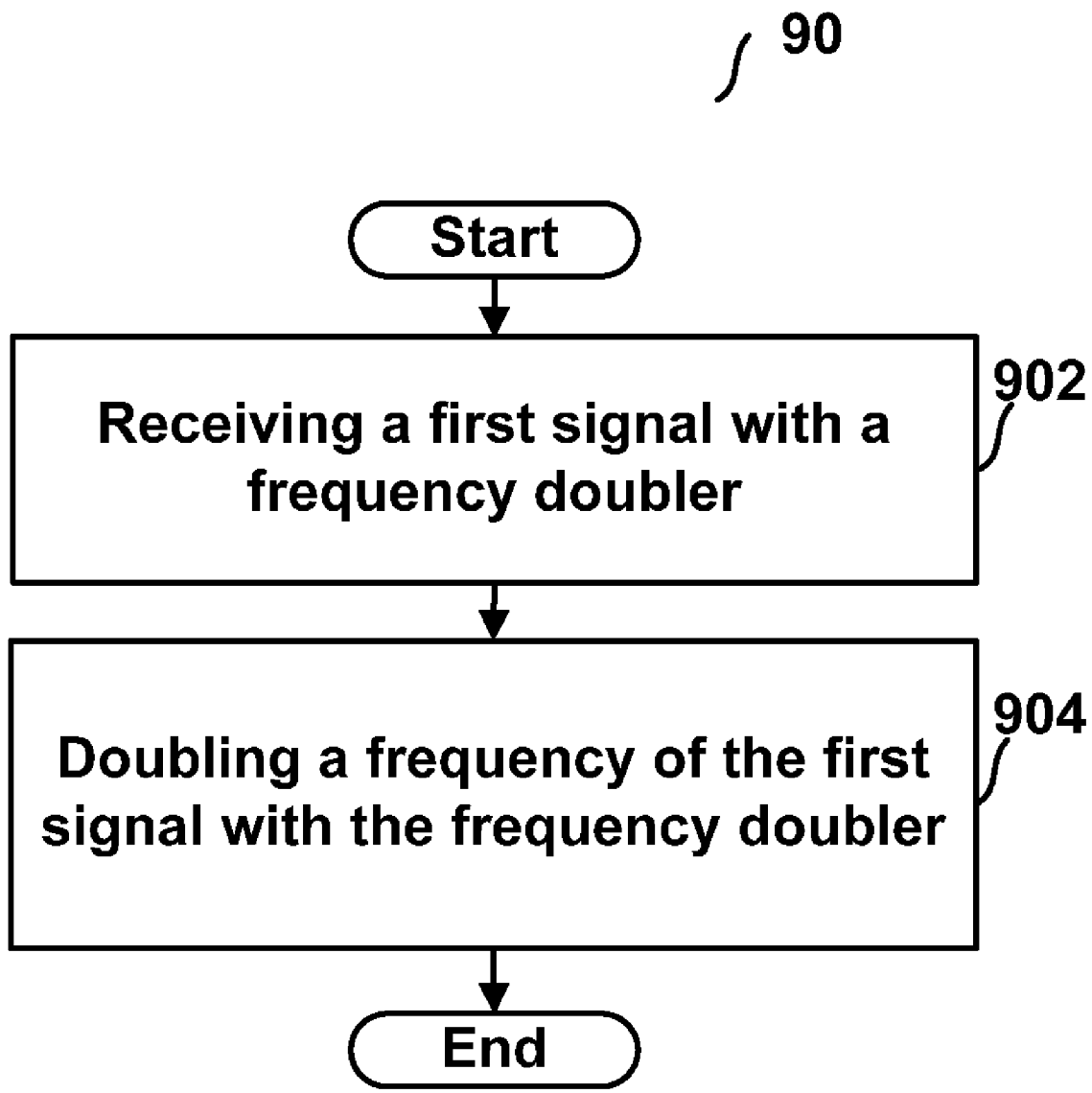
FIG. 14 is a flow chart illustrating a method for frequency doubling according to an embodiment of the present invention.

Specifically, the pulse generator 81 is configured to receive the second signal 47 and use the same to generate a pulse sequence signal e, as illustrated in FIG. 13. It can be seen that there is a negative pulse at each rising edge of the signal 47, e.g., at $t_7$.

The charge and discharge circuit 82 is configured to receive the pulse sequence signal e and a second control signal 48, change a voltage at an output end of the charge and discharge circuit 82, i.e., a voltage of signal f, according to the pulse sequence signal e at a speed which is at least partly determined by the second control signal 48. According to embodiments of the invention, the voltage of the second control signal 48 may be: (1) static; (2) manually controlled; (3) automatically controlled, which is similar to the first control signal 42.

The ADC 83 is configured to receive and convert the signal f from analog to digital, so as to generate the first signal 41.

Figure 9:
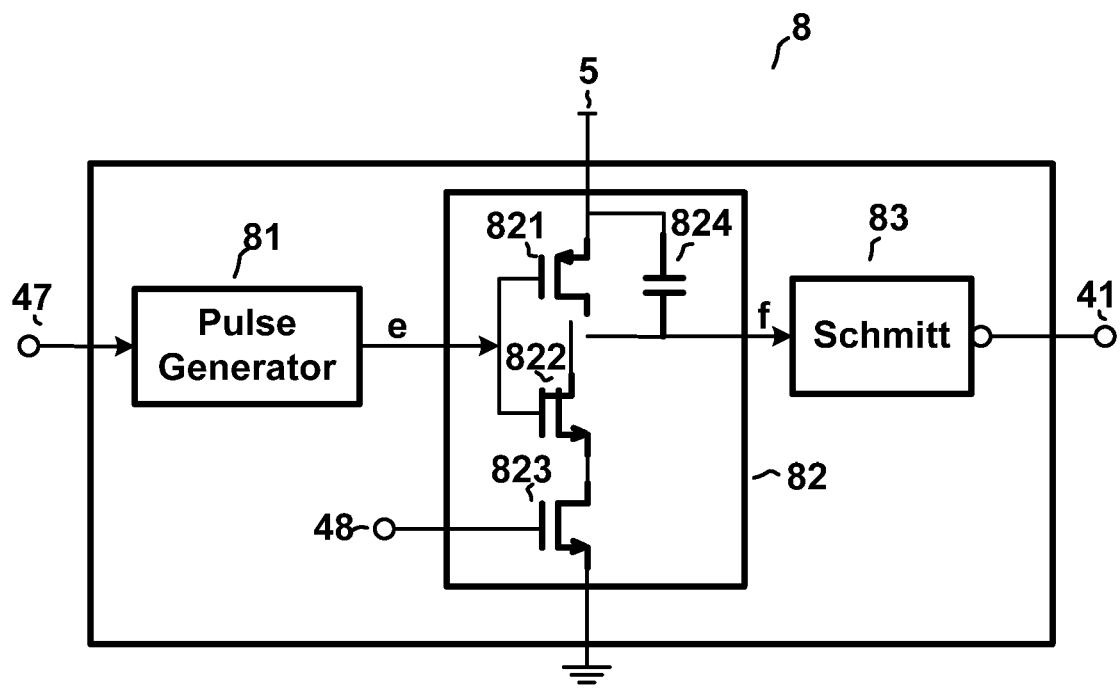
FIG. 9 is a circuit diagram illustrating a detailed view of the duty cycle changing circuit in FIG. 8.

The charge and discharge circuit 82 has various embodiments, one of which is illustrated in FIG. 9, wherein the voltage at the output end of the charge and discharge circuit 82 decreases at a speed at least partly determined by the second control signal 48.

As illustrated in FIG. 9, the charge and discharge circuit 82 comprises a third P-type MOSFET 821 (MOS 821), a fifth N-type MOSFET 822 (MOS 822), a sixth N-type MOSFET 823 (MOS 823) and a third capacitor 824. A gate of the MOS 821 and a gate of the MOS 822 are connected with each other and configured to receive the pulse sequence signal e, a source of the MOS 821 and a terminal of the third capacitor 824 are connected with each other and provided with the positive working voltage, e.g., Vdd. A drain of the MOS 821 is connected with a drain of the MOS 822 and another terminal of the third capacitor 824 to form the output end of the charge and discharge circuit 82 and output the signal f. A source of the MOS 822 is connected with a drain of the MOS 823. A gate of the MOS 823 is configured to receive the second control signal 48. A source of the MOS 823 is grounded.

According to another embodiment of the invention, a terminal of the capacitor 824 (the upper terminal illustrated in FIG. 9) can be grounded rather than connected to Vdd, while the other terminal of the capacitor 824 is still connected to the drains of MOSs 821 and 822.

In FIG. 9, the ADC 83 includes a Schmitt trigger 83. In other embodiments of the invention, the ADC 83 may include a comparator or any other suitable ADC.

Therefore, at a negative pulse in the pulse sequence signal e, e.g., at $t_7$, the MOS 821 is closed and the lower terminal of capacitor 824 is charged to Vdd, which means the voltage of signal f is Vdd, hence signal 41 is digital 0. When the pulse sequence signal e changes back to digital 1, e.g, at $t_8$, the MOS 821 is open while the MOS 822 is closed. As the MOS 823 is closed by the second control signal 48, the lower terminal of capacitor 824 discharges through MOSs 822 and 823. When the parameters of MOSs 822, 823 and the capacitor 824 are already given, the capacitor 824 discharges at a speed determined by the second control signal 48. Therefore, the Schmitt trigger 83 turns over to output digital 1 earlier when the voltage of the second control signal 48 increases. That's to say, with the aid of the charge and discharge circuit 82, all of the rising edges of the signal 41 are under control. Since the falling edges of signal 41 synchronize to rising edges of signal 47, the duty cycle of signal 41 can be controlled with the voltage of signal 48.

Figure 10:
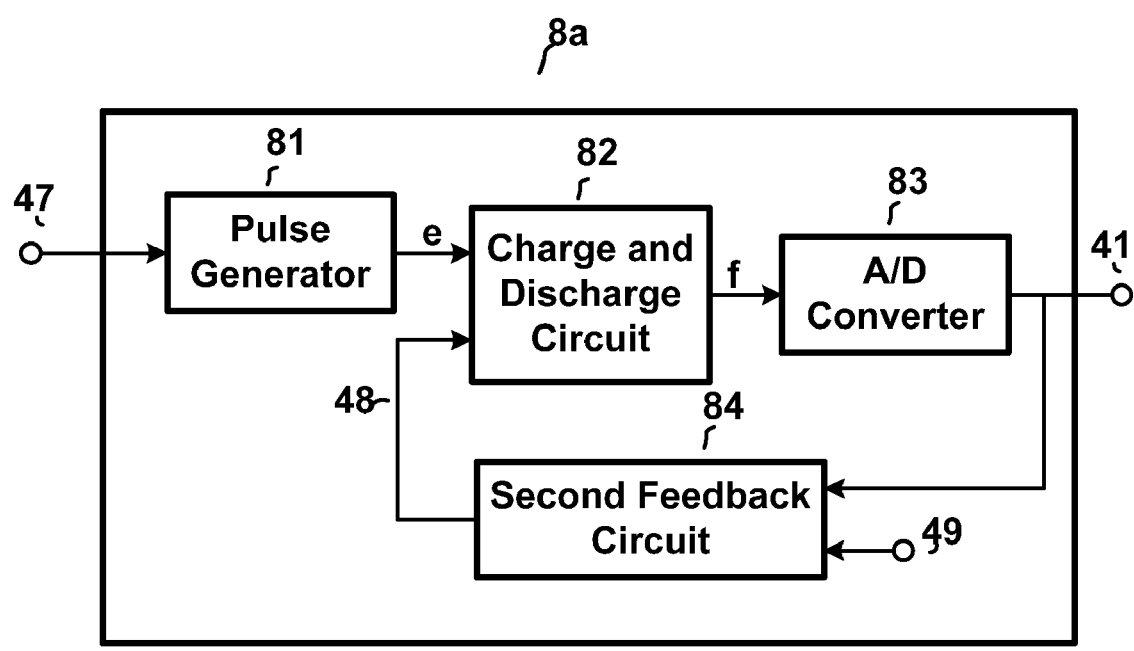
FIG. 10 is a block diagram illustrating a duty cycle changing circuit according to another embodiment of the present invention.

According to an embodiment of the invention, as illustrated in FIG. 10, a duty cycle changing circuit 8a further includes a second feedback circuit 84. The second feedback circuit 84 is configured to receive a second reference signal 49 and the signal 41 generated by the ADC 83 so as to generate the second control signal 48, which is dynamic.

Figure 11:
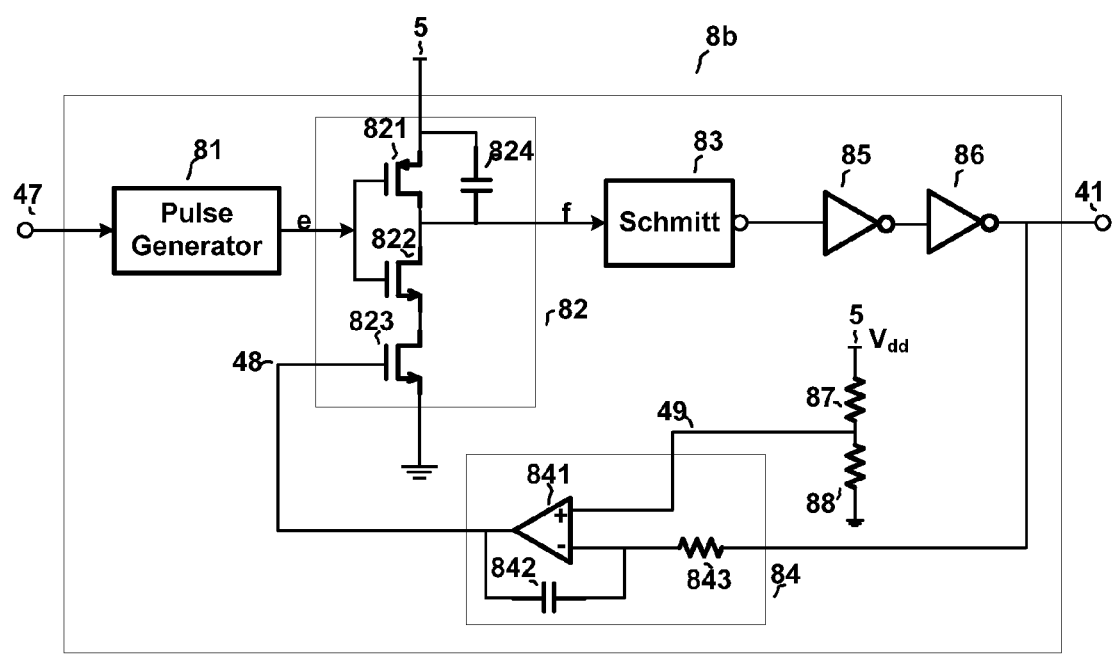
FIG. 11 is a circuit diagram illustrating a detailed view of the duty cycle changing circuit in FIG. 10.

The second feedback circuit 84 has various embodiments, one of which is illustrated in FIG. 11.

Similar to the first feedback circuit 6 as discussed above, the second feedback circuit 84 in the duty cycle changing circuit 8b includes a second error amplifier 841 configured to receive the second reference signal 49 and the first signal 41. The capacitor 842 and the resistor 843 form an integral circuit to provide a negative input end of the error amplifier 841 with an average voltage of the signal 41 determined by equation (2):

$$V_{average} = Duty_{41} * V_{dd} \quad (2)$$

Where $Duty_{41}$ is a duty cycle of signal 41. Therefore, by setting resistances of resistors 87 and 88, it is possible to generate a first signal with a certain duty cycle as needed. For example, if resistors 87 and 88 have the same resistance, the duty cycle of signal 41 will be 0.5 finally.

In addition, additional two inverters 85 and 86 are provided in this embodiment to increase a capability of the first signal 41 to drive a load.

According to embodiments of the invention, the frequency doubler 1, 1a or 1b can be employed by various devices, including but not limited to chargepumps.

According to an embodiment of the invention, a method 90 for frequency doubling is provided. At 902, a frequency doubler 1, 1a or 1b as discussed above receives a first signal 41. At 904, the frequency doubler 1, 1a or 1b doubles the frequency of the first signal 41.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A frequency doubler, comprising:
   a non-overlapping signal generation circuit configured to receive a first signal and a first control signal and generate a first and a second non-overlapping signal, each of the first and second non-overlapping signals having a frequency of the first signal, wherein an average of a duty cycle of the first non-overlapping signal and a duty cycle of the second non-overlapping signal is determined by the first control signal;
   a combination circuit configured to receive and combine the two non-overlapping signals to generate a frequency-doubled signal;
   wherein the non-overlapping signal generation circuit comprises:
      an input module configured to receive the first signal and generate a first and a second clock signal according to the first signal;
      a first controllable delay module configured to receive the first clock signal and the first control signal, apply a first delay determined at least partly by the first control signal to the first clock signal so as to generate a first delayed signal;
      a second controllable delay module configured to receive the second clock signal and the first control signal, apply a second delay determined at least partly by the first control signal to the second clock signal so as to generate a second delayed signal;
   wherein the input module is further configured to receive the first and second delayed signals and generate the first and second clock signals according to the first signal, the first delayed signals and the second delayed signal; and
   an output module, configured to receive the first delayed signal and generate the first non-overlapping signal accordingly, receive the second delayed signal and generate the second non-overlapping signal accordingly.

2. The frequency doubler of claim 1, wherein the combination circuit comprises an OR gate.

3. The frequency doubler of claim 1, wherein the input module includes a first inverter, a second inverter, a third inverter, a first NAND gate and a second NAND gate, wherein an input end of the first inverter and an input end of the first NAND gate are configured to receive the first signal, another input end of the first NAND gate is configured to receive the second delayed signal, an output end of the first inverter is connected to an input end of the second NAND gate, another input end of the second NAND gate is configured to receive the first delayed signal, an output end of the first NAND gate is connected to an input end of the second inverter, an output end of the second NAND gate is connected to an input end of the third inverter, the second inverter is configured to output the first clock signal, the third inverter is configured to output the second clock signal;

the output module includes a fourth inverter and a fifth inverter, wherein an input end of the fourth inverter is configured to receive the first delayed signal, an input end of the fifth inverter is configured to receive the second delayed signal, the fourth inverter is configured to output the first non-overlapping signal, the fifth inverter is configured to output the second non-overlapping signal.

4. The frequency doubler of claim 1, wherein the first controllable delay module and the second delay module are jointly configured to:

when a voltage of the first control signal increases, decrease a duty ratio of the first non-overlapping signal and a duty ratio of the second non-overlapping signal, and when a voltage of the first control signal decreases, increase a duty ratio of the first non-overlapping signal and a duty ratio of the second non-overlapping signal.

5. The frequency doubler of claim 1, wherein the first controllable delay module includes: a first P-type MOSFET, a first N-type MOSFET, a second N-type MOSFET and a first capacitor, a source of the first P-type MOSFET is provided with a positive working voltage, a gate of the first P-type MOSFET and a gate of the first N-type MOSFET are configured to receive the first clock signal, a source of the first N-type MOSFET is connected with a drain of the second N-type MOSFET, a drain of the first P-type MOSFET is connected with a drain of a first N-type MOSFET and a terminal of the first capacitor to generate the first delayed signal, a source of the second N-type MOSFET and another terminal of the first capacitor are grounded, a gate of the second N-type MOSFET is configured to receive the first control signal.

6. The frequency doubler of claim 1, wherein the second delay module includes a second P-type MOSFET, a third N-type MOSFET, a fourth N-type MOSFET and a second capacitor, a source of the second P-type MOSFET is provided with a positive working voltage, a gate of the second P-type MOSFET and a gate of the third N-type MOSFET are configured to receive the second clock signal, a source of the third N-type MOSFET is connected with a drain of the fourth N-type MOSFET, a drain of the second P-type MOSFET is connected with a drain of a third N-type MOSFET and a terminal of the second capacitor to generate the second delayed signal, a source of the fourth N-type MOSFET and another terminal of the second capacitor are grounded, a gate of the fourth N-type MOSFET is configured to receive the first control signal.

7. The frequency doubler of claim 1, wherein in the non-overlapping signal generation circuit, elements with corresponding functions have approximately the same electrical parameters.

8. A frequency doubler, comprising:

a non-overlapping signal generation circuit configured to receive a first signal and a first control signal and generate a first and a second non-overlapping signal, each of the first and second non-overlapping signals having a frequency of the first signal, wherein an average of a duty cycle of the first non-overlapping signal and a duty cycle of the second non-overlapping signal is determined by the first control signal;

a combination circuit configured to receive and combine the two non-overlapping signals to generate a frequency-doubled signal;

a first feedback circuit configured to receive the frequency-doubled signal and a first reference signal, use the frequency-doubled signal and the first reference signal to generate the first control signal; and the first feedback circuit comprising a first error amplifier configured to receive a first reference signal and the frequency-doubled signal, generate the first control signal according to an error between a voltage of the first reference signal and an average voltage of the frequency-doubled signal.

9. The frequency doubler of claim 8, wherein the voltage of the first reference signal is adjustable.

10. A frequency doubler, comprising:

a non-overlapping signal generation circuit configured to receive a first signal and a first control signal and generate a first and a second non-overlapping signal, each of the first and second non-overlapping signals having a frequency of the first signal, wherein an average of a duty cycle of the first non-overlapping signal and a duty cycle of the second non-overlapping signal is determined by the first control signal;

a combination circuit configured to receive and combine the two non-overlapping signals to generate a frequency-doubled signal; and a duty cycle changing circuit configured to receive a second signal and change a duty cycle of the second signal to a preset value, so as to generate the first signal, the duty cycle changing circuit comprising a pulse generator configured to receive the second signal and use the second signal to generate a pulse sequence signal;

a charge and discharge circuit configured to receive the pulse sequence signal and a second control signal, change a voltage at an output end of the charge and discharge circuit according to the pulse sequence signal at a speed which is at least partly determined by the second control signal;

an analog-to-digital converter connected to the output end of the charge and discharge circuit and convert an output of the charge and discharge circuit from analog to digital, so as to generate the first signal.

11. The frequency doubler of claim 10, wherein the preset value is about 50%.

12. The frequency doubler of claim 10, wherein the voltage at the output end of the charge and discharge circuit decreases at a speed at least partly determined by the second control signal.

13. The frequency doubler of claim 10, wherein the charge and discharge circuit comprises a third P-type MOSFET, a fifth N-type MOSFET, a sixth N-type MOSFET and a third capacitor, a gate of the third P-type MOSFET and a gate of the fifth N-type MOSFET are connected with each other and configured to receive the pulse sequence signal, a source of the third P-type MOSFET and a terminal of the third capacitor are connected with each other and provided with the positive working voltage, a drain of the third P-type MOSFET is connected with a drain of the fifth N-type MOSFET and another terminal of the third capacitor to form the output end of the charge and discharge circuit, a source of the fifth N-type MOSFET is connected with a drain of the sixth N-type MOSFET, a gate of the sixth N-type MOSFET is configured to receive the second control signal, a source of the sixth N-type MOSFET is grounded.

14. The frequency doubler of claim 10, wherein the duty changing circuit further comprises:

a second feedback circuit configured to receive the generated first signal and a second reference signal, use the first signal and the second reference signal to generate the second control signal.

15. The frequency doubler of claim 14, wherein the second feedback circuit comprises:

a second error amplifier configured to receive the second reference signal and the first signal, change a voltage at an output end of the second error amplifier according to an error between a voltage of the second reference signal and an average voltage of the first signal.

16. The frequency doubler of claim 14, wherein the voltage of the second reference signal is adjustable.

* * * * *